(12) United States Patent
Kwon

(10) Patent No.: US 7,399,690 B2
(45) Date of Patent: Jul. 15, 2008

(54) METHODS OF FABRICATING SEMICONDUCTOR DEVICES AND STRUCTURES THEREOF

(75) Inventor: O Sung Kwon, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 44 days.

(21) Appl. No.: 11/268,924

(22) Filed: Nov. 8, 2005

(65) Prior Publication Data

US 2007/0102775 A1    May 10, 2007

(51) Int. Cl.
*H01L 21/3205* (2006.01)

(52) U.S. Cl. .................. 438/595; 438/184; 438/706; 438/745; 257/E21.626; 257/E21.64

(58) Field of Classification Search .................. 438/184, 438/230, 303, 595, 704, 706, 745; 257/E21.626, 257/E21.64
See application file for complete search history.

(56) References Cited

U.S. PATENT DOCUMENTS

| | | | |
|---|---|---|---|
| 5,847,428 A | 12/1998 | Fulford, Jr. et al. | |
| 6,806,149 B2 | 10/2004 | Bu et al. | |
| 7,064,027 B2 * | 6/2006 | Ng et al. ................. | 438/238 |
| 2004/0063260 A1 | 4/2004 | Bu et al. | |
| 2004/0171261 A1 | 9/2004 | Song et al. | |
| 2005/0118769 A1 | 6/2005 | Kammler et al. | |
| 2005/0142760 A1 | 6/2005 | Shim | |
| 2005/0208726 A1 | 9/2005 | Chang et al. | |
| 2006/0281271 A1 * | 12/2006 | Brown et al. ............. | 438/303 |

* cited by examiner

*Primary Examiner*—Quoc D Hoang
(74) *Attorney, Agent, or Firm*—Slater & Matsil, L.L.P.

(57) ABSTRACT

Methods of forming spacers on sidewalls of features of semiconductor devices and structures thereof are disclosed. A preferred embodiment comprises a semiconductor device including a workpiece and at least one feature disposed over the workpiece. A first spacer is disposed on the sidewalls of the at least one feature, the first spacer comprising a first material. A first liner is disposed over the first spacer and over a portion of the workpiece proximate the first spacer, the first liner comprising the first material. A second spacer is disposed over the first liner, the second spacer comprising a second material. A second liner is disposed over the second spacer, the second liner comprising the first material.

16 Claims, 3 Drawing Sheets

METHODS OF FABRICATING SEMICONDUCTOR DEVICES AND STRUCTURES THEREOF

TECHNICAL FIELD

The present invention relates generally to the fabrication of semiconductor devices, and more particularly to the formation of insulating spacers on sidewalls of features of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET), as an example. Transistors of semiconductor devices are typically formed by depositing a gate dielectric material over a substrate, and depositing a gate material over the gate dielectric material. The gate material and the gate dielectric material are patterned using lithography techniques, and dopants are implanted into the substrate proximate the gate and gate dielectric to form source and drain regions.

Sidewall spacers are typically formed on the sidewalls of the gate and gate dielectric, either before, after, or both before and after the dopants are implanted into the substrate. Sidewall spacers typically comprise silicon nitride, and are usually formed by depositing a layer of silicon nitride over the gate, gate dielectric, and exposed portions of the substrate, and etching the layer of silicon nitride to remove the layer of silicon nitride from the top surface of the gate, and from over the top surface of the substrate, yet leaving the silicon nitride disposed on the sidewalls of the gate and gate dielectric, forming a nitride spacer.

Controlling the thickness and width of nitride sidewall spacers is difficult. Forming uniform sidewall spacers across a surface of a semiconductor device is a key factor in obtaining uniform device performance in some applications.

Thus, what are needed in the art are improved methods of forming insulating spacers for features of semiconductor devices.

SUMMARY OF THE INVENTION

These and other problems are generally solved or circumvented, and technical advantages are generally achieved, by preferred embodiments of the present invention, which provide novel methods of forming spacers on features of semiconductor devices, and structures thereof.

In accordance with a preferred embodiment of the present invention, a semiconductor device includes a workpiece having at least one feature disposed over the workpiece. A first spacer is disposed on sidewalls of the at least one feature, the first spacer comprising a first material. A first liner is disposed over the first spacer and over a portion of the workpiece proximate the first spacer, the first liner comprising the first material. A second spacer is disposed over the first liner, the second spacer comprising a second material. A second liner is disposed over the second spacer, the second liner comprising the first material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method of forming spacers on sidewalls of a gate and gate dielectric of a transistor device having a single gate. Embodiments of the present invention may also be applied, however, to other structures and features formed on semiconductor devices, such as portions of capacitors, diodes, conductive lines or features, memory cells, multiple gate transistors such as FinFETs or tri-gate FETs, or other devices having a topography that would benefit from an insulating spacer being formed on sidewalls of a feature, as examples.

In some semiconductor devices, the partial or full removal of the nitride spacer after implantation processes may be required, to enhance the device performance through what is referred to in the art as a "stress effect." However, removing nitride material can result in edges of the nitride material being unsmooth and having a thickness and width that varies from feature to feature across a surface of a wafer. For example, in semiconductor devices that have both nested features and isolated features, there can be a large variation in the thickness and width of spacers formed on nested features compared to the thickness and width of spacers formed on isolated features.

Figure 1:
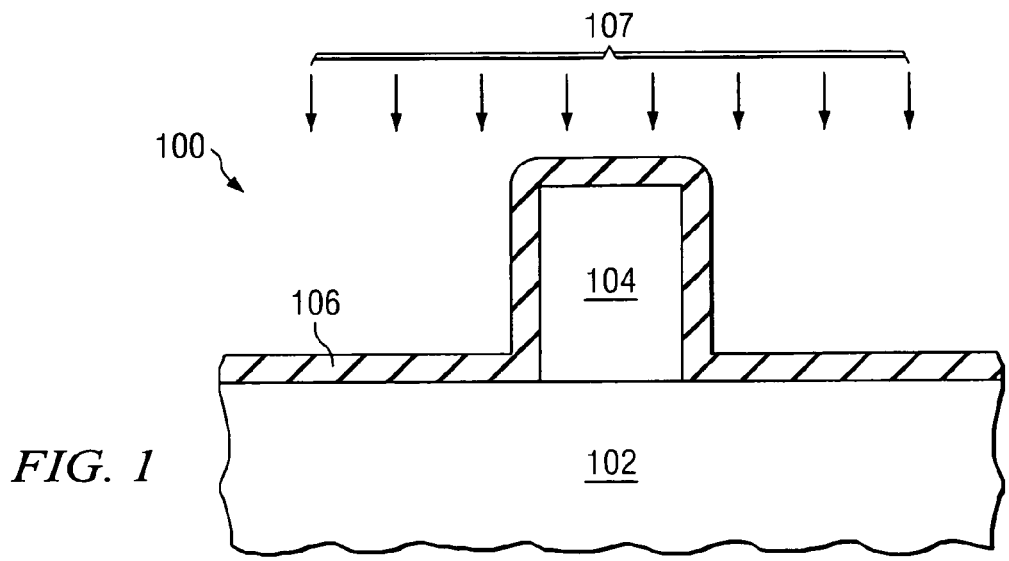
FIGS. 1 through 3 show cross-sectional views of a semiconductor device at various stages of manufacturing according to a less-preferred embodiment of the present invention, wherein nitride spacers are formed on sidewalls of features of a semiconductor device using a "pull-back" method.
Figure 2:
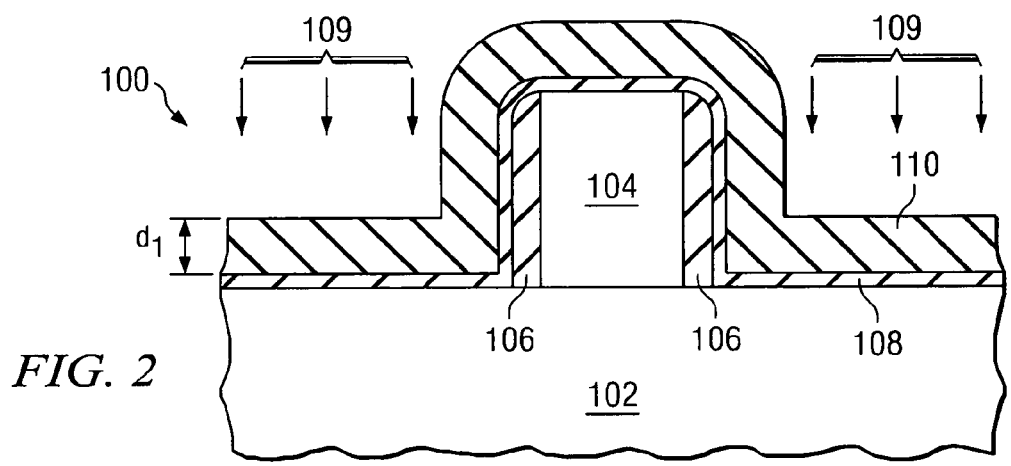
Figure 3:
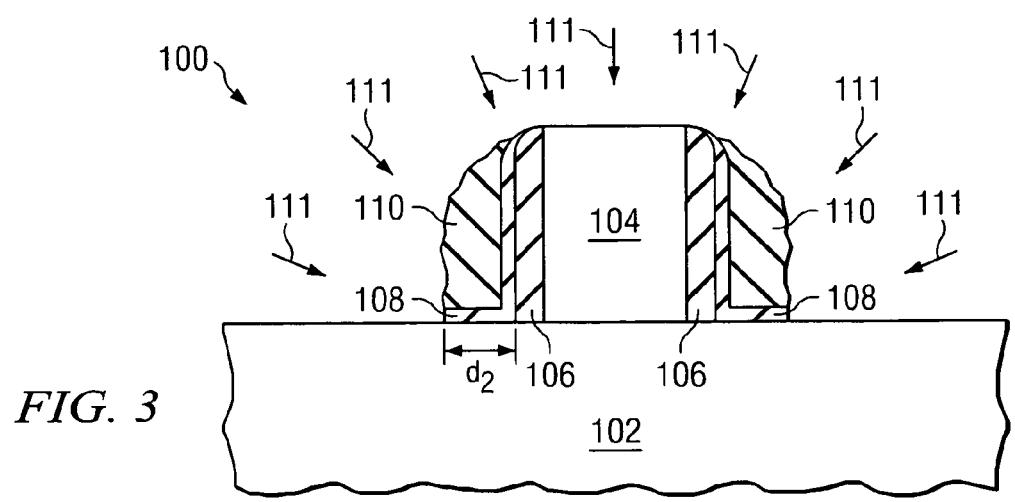

A less-preferred embodiment of a method of forming an insulating spacer on a sidewall of a transistor gate will first be described. FIGS. 1 through 3 show cross-sectional views of a semiconductor device 100 at various stages of manufacturing, wherein spacers are formed on sidewalls of features of the semiconductor device 100 using a "pull-back" method. With reference now to FIG. 1, there is shown a substrate 102 comprising a semiconductor wafer having a feature 104 formed thereon. The feature 104 may comprise a gate dielectric and a gate material (not shown) disposed over the gate dielectric.

To form the spacer on the sidewalls of the feature 104, a layer of silicon dioxide 106 is deposited over the substrate 102 and the feature 104. An anisotropic etch process 107 is used to preferentially etch away the layer of silicon dioxide 106 from top surfaces of the feature 104 and the substrate 102, leaving a first spacer 106 disposed on the sidewalls of the feature 104, as shown in FIG. 2.

A thin layer of silicon dioxide 108 is formed over the top surface of the feature 104, exposed surfaces of the substrate 102, and over the first spacers 106, as shown in FIG. 2. The thin layer of silicon dioxide 108 comprises an oxide liner.

A layer of silicon nitride 110 is deposited over the thin layer of silicon dioxide 108, also shown in FIG. 2. The layer of silicon nitride 110 may comprise a thickness $d_1$ as deposited of about 350 Angstroms, for example.

The layer of silicon nitride 110 is etched using an anisotropic etch process 109, as shown in FIG. 2. A portion of the layer of silicon nitride 110 is left remaining on the sidewalls of the feature 104 over the thin layer of silicon dioxide 108 after the anisotropic etch process 109, forming a second spacer 110 over the thin layer of silicon dioxide 108 on the sidewalls of the feature 104, as shown in FIG. 3. The thin layer of silicon dioxide 108 may also be removed from the top surface of the substrate 102 and the feature 104, either as a part of the anisotropic etch process 109 or using a separate etch process, for example.

After the first spacer 106, oxide liner 108, and second spacer 110 are formed, the exposed portion of the workpiece 102 may be implanted with a dopant species to form source and drain regions of the transistor (not shown). The semiconductor device 100 may also be silicided, e.g., to form silicide on the source and drain regions (e.g., within the substrate 102 proximate the feature 104) and to form silicide on the gate of the feature 104.

Either before or after the dopant species implantation process and/or silicidation process, an isotropic etch process 111 is used to reduce the size of the second spacer 110, as shown in FIG. 3. The isotropic etch process 111 comprises a "pull-back" process. The width $d_2$ of the second spacer 110 is critical, because the size of the source and drain regions proximate the second spacer 110 are often dependent upon the width $d_2$ of the second spacer 110, for example. The amount of nitride, e.g., the width $d_2$ of the second spacer 110 also effects the stress of polysilicon, e.g., that the feature 104 may comprise.

The method of forming sidewall spacers illustrated in FIGS. 1 through 3 is a less-preferred embodiment because it is difficult to control the width $d_2$ of the second spacer 110 using this method, particularly for semiconductor devices 100 that may have isolated features 104 in some regions and more densely populated features 104 in other regions, for example. For all transistors to have uniform operational parameters and device performance on a single die, the source and drain regions should be the same size, and the stress effects on the features 104 should be the same, and thus, the spacers 110 need to be the same size, for example. However, isolated features 104 tend to have spacers 110 that are wider than spacers 110 of densely populated features 104, for example, due to the etch process used to pull-back the second spacer 110.

Another problem with the less-preferred method of forming a spacer on sidewalls of the feature 104 shown in FIGS. 1 through 3 is that the edges of the second spacer 110 become jagged and rough, and the thickness of the second spacer 110 may be unstable. A spacer 110 with an unsmooth surface and/or unstable thickness is undesirable because the stress effects on the feature 104 are deleteriously affected by the thickness of second spacer 110 after the "pull-back" etch process, and also, the width of the spacer 110 is unpredictable.

Preferred embodiments of the present invention provide well-controlled methods of forming sidewall spacers on features of semiconductor devices. The spacers have a smooth surface, stable thickness across a surface of a workpiece, and also have a well-controlled width.

Figure 4:
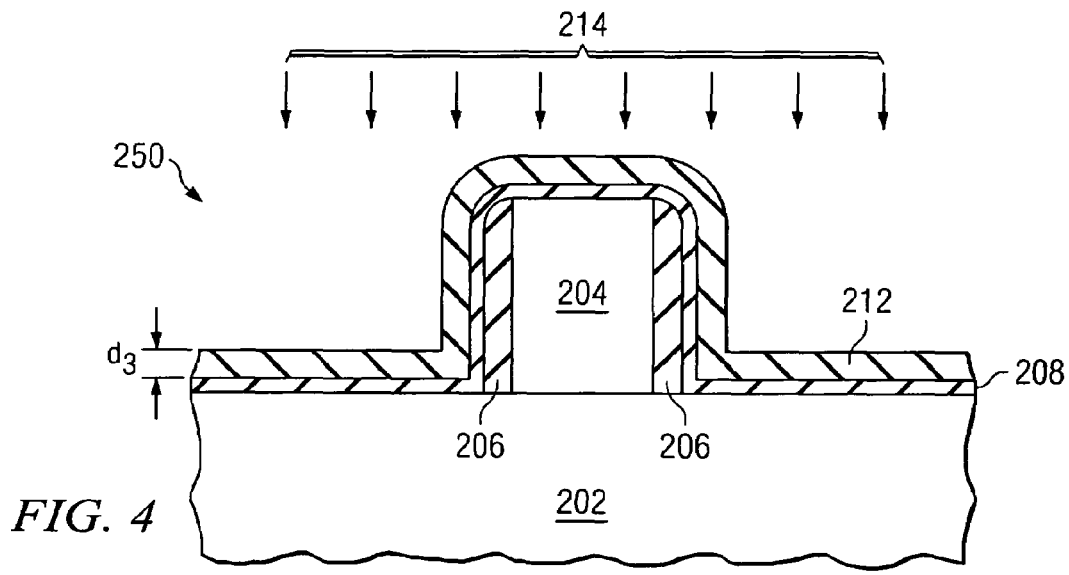
FIGS. 4 through 8 show a semiconductor device at various stages of manufacturing in accordance with a preferred embodiment of the present invention, wherein an oxide liner is used to control the width of a nitride spacer on the sidewalls of features.
Figure 5:
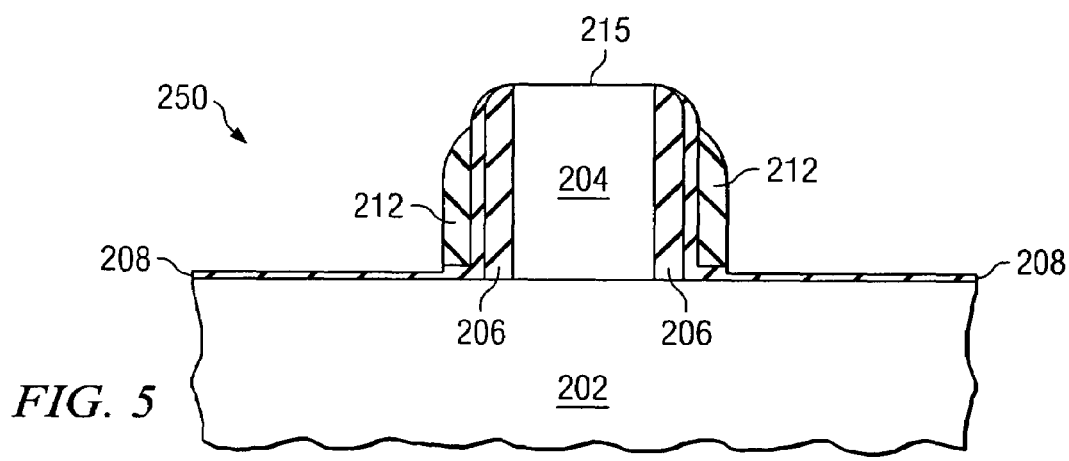
Figure 6:
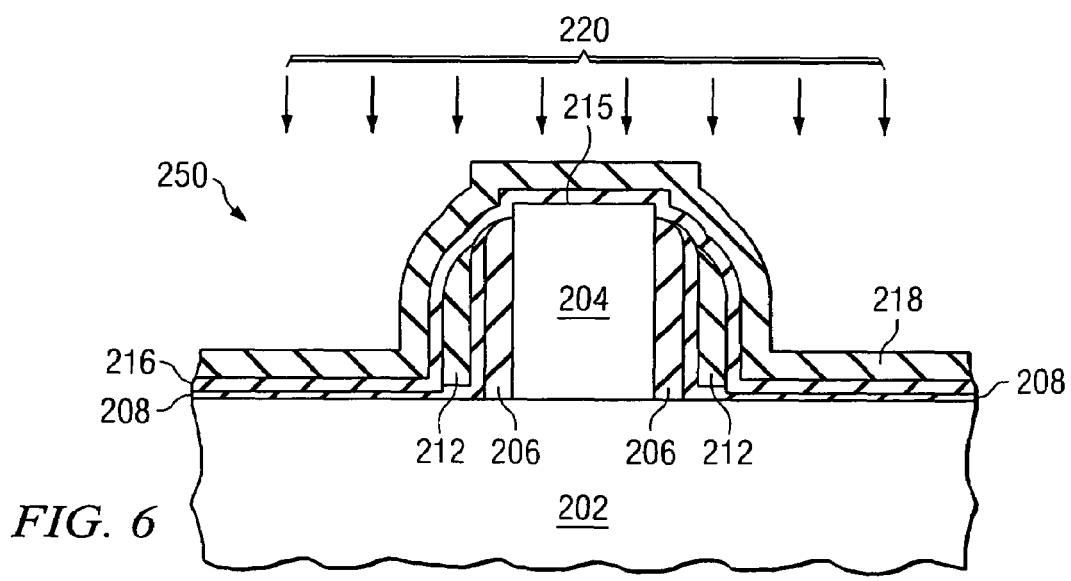
Figure 7:
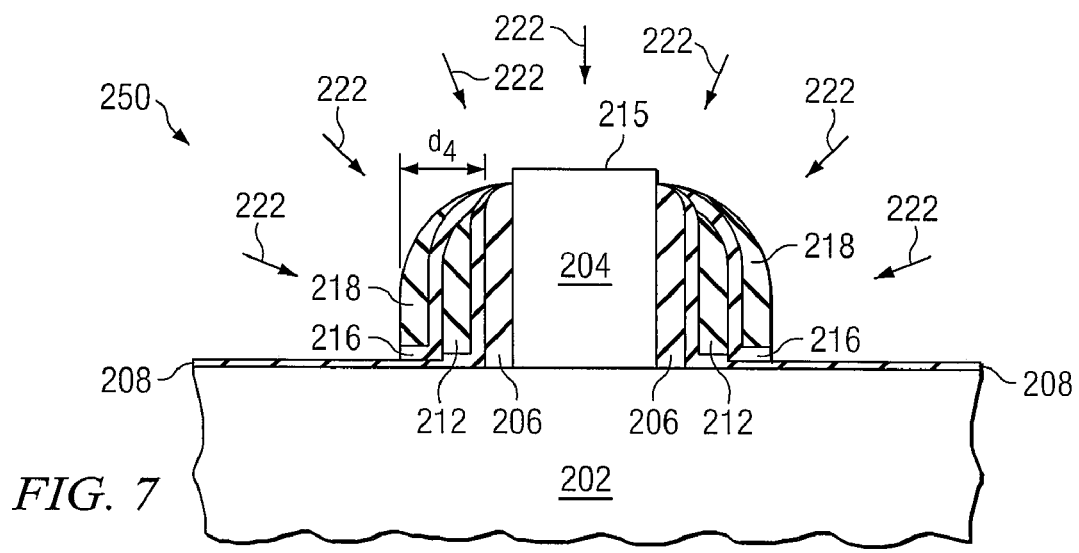

FIGS. 4 through 8 show cross-sectional views of a semiconductor device 250 at various stages of manufacturing in accordance with a preferred embodiment of the present invention. Embodiments of the present invention achieve technical advantages by providing a method of forming insulating spacers 206/208/212/216, shown in FIG. 8, for sidewalls of a feature 204 formed on a semiconductor device 250, wherein the width of the spacers 206/208/212/216 is well-controlled and the surfaces are smooth. To summarize generally a preferred method of an embodiment of the present invention, a first portion 212 of a nitride spacer is formed, as shown in FIGS. 4 and 5, and an oxide liner 216 is deposited over the first portion 212 of the nitride spacer, as shown in FIG. 6. A second portion 218 of a nitride spacer is formed over the oxide liner 216, as shown in FIGS. 6 and 7. After other processing steps are performed, such as silicidation and/or dopant species implantation, or annealing processes, the second portion 218 of the nitride spacer is removed. The oxide liner 216 between the two portions 212 and 218 of the nitride spacer is used to control the width of the nitride spacer 212 (e.g., the first portion 212 of the nitride spacer that is left remaining in the structure 250) on the sidewalls of features 204.

A preferred embodiment of the present invention will next be described in more detail. First, with reference now to FIG. 4, there is shown a semiconductor device 250 in a cross-sectional view including a workpiece 202. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate, for example.

A feature 204 having sidewalls is formed over the workpiece 202. For example, one or more material layers may be deposited over the workpiece 202, and the material layer or layers are then patterned using lithography to form the feature 204. In one embodiment wherein the semiconductor device 250 comprises a transistor, the feature 204 comprises a gate dielectric, and a gate disposed over the gate dielectric, as an example, to be described further herein with reference to FIG. 9, for example. Alternatively, the feature 204 may also comprise a portion of other types of electrical devices, such as a portion of a conductive line, capacitor, diode, memory cell, single gate transistor, multiple gate transistor, or other elements, as examples. The feature 204 preferably has a topography that extends above a top surface of the workpiece 202, as shown, and thus has exposed sidewalls. Although only one feature 204 is shown in the figures, there may be one or more features 204 formed simultaneously or in separate processing steps across the surface of the workpiece 202, for example.

A cross-sectional view of the feature 204 is shown in the figures. The feature 204 comprises a three-dimensional structure; e.g., the feature 204 extends in and out of the drawing. A cross-section of the feature 204 in and out of the drawing may comprise a square, ellipse, circles, or rectangle, as examples, although alternatively, the feature 204 may comprise other shapes.

A first spacer 206 is formed on the sidewalls of the feature 204. The first spacer 206 preferably comprises a first material. The first material of the first spacer 206 preferably comprises an oxide material, and in a preferred embodiment, the first material of the first spacer 206 preferably comprises silicon dioxide ($SiO_2$), although alternatively, the first spacer 206 may comprise other materials. The first spacer 206 preferably comprises a thickness of about 150 Angstroms or less, although alternatively, the first spacer 206 may comprise other dimensions. The first spacer 206 is also referred to herein as a first oxide layer and a fourth material layer (e.g., in the claims). The first spacer 206 is preferably formed on all sidewalls of the feature 204, e.g., also in the views of the feature 204 not shown, e.g., on the front and back of the feature 204 as viewed in the drawings.

The first spacer 206 is preferably formed by a conformal deposition of a material, and an anisotropic etch process is used to remove the first spacer 206 material from over the top surface of the workpiece 202 and top surface of the feature 204. For example, in one embodiment, the first spacer 206 is formed by depositing a 150 Angstroms or less layer of silicon dioxide, and using an anisotropic etch process to remove the first spacer 206 material from the top surfaces of the workpiece 202 and the feature 204. The first spacer 206 material may be deposited by chemical vapor deposition (CVD), atomic layer deposition (ALD), metal organic chemical vapor deposition (MOCVD), physical vapor deposition (PVD), or jet vapor deposition (JVD), as examples, although alternatively, the first spacer 206 material may be deposited using other suitable deposition techniques. The first spacer 206 material may be substantially conformal as deposited, for example. The anisotropic etch process to form the first spacer 206 preferably comprises a gas containing C, H, F, O, or combinations thereof, as examples, although alternatively, other methods and chemistries may also be used.

The first spacer 206 after the anisotropic etch process may be thicker at the bottom proximate the workpiece 202 than at the top of the feature 204, as shown. The first spacer 206 may be recessed below the top surface of the feature 204 slightly, e.g., by a few Angstroms or a few tens of Angstroms, due to the directional etching of the anisotropic etch process. After the anisotropic etch process, the first spacer 206 preferably comprises a thickness proximate the workpiece 202 of about 150 Angstroms or less, and more preferably comprises a thickness of about 50 Angstroms or less in another embodiment, as an example.

Next, a first liner 208 is formed over the first spacer 206 and the exposed top surfaces of the workpiece 202 and the feature 204, as shown in FIG. 4. The first liner 208 is also referred to herein as a second oxide layer and a fifth material layer (e.g., in the claims). The first liner 208 preferably comprises the first material that the first spacer 206 comprises, in one embodiment. The first liner 208 preferably comprises a substantially conformal deposition of about 50 Angstroms or less of silicon dioxide in one embodiment, for example. The first liner 208 may be deposited using a similar deposition technique as described for the deposition of the first spacer 206 material, for example.

A second spacer 212 is formed over the first liner 208 over at least the sidewalls of the feature 204, as shown in FIGS. 4 and 5. The second spacer 212 is also referred to herein as a first portion of a nitride spacer (e.g., previously in this Detailed Description of Illustrative Embodiments section), or a first material layer or a first nitride layer (e.g., in the claims).

To form the second spacer 212, first, a second spacer 212 material is deposited over the first liner 208, as shown in FIG. 4. The second spacer 212 material preferably comprises a material may be etched selectively to the first liner 208 and first spacer 206 material, for example. The second spacer 212 material preferably comprises a second material, wherein the second material is different than the first material of the first liner 208 and the first spacer 206, in one embodiment.

The second spacer 212 material preferably comprises a nitride material, for example. The second spacer 212 material preferably comprises silicon nitride ($Si_xN_y$) deposited in a thickness of about 200 Angstroms or less, although alternatively, the second spacer 212 material may comprise other insulating materials and dimensions. The second spacer 212 material may be deposited by CVD, ALD, MOCVD, PVD, or JVD, as examples, although alternatively, the second spacer 212 material may be deposited using other suitable deposition techniques. The second spacer 212 material is preferably substantially conformal as deposited, as shown in FIG. 4. The second spacer 212 material preferably comprises a thickness $d_3$ that is approximately equal to, or slightly larger than a desired width of the second spacer 212 after an anisotropic etch process 214 used to form the second spacer 212, for example.

Next, an anisotropic etch process 214 is used to remove the second spacer 212 material from the top surfaces of the feature 204 and the workpiece 202, leaving second spacers 212 formed on the sidewalls of the feature 204, as shown in FIG. 5. The second spacers 212 may be recessed slightly below the top surface of the feature 204, and/or also may be recessed slightly below the top surface of the first spacer 206 and first liner 208 formed on the sidewalls of the feature 204, as shown, due to the directional etch of the anisotropic etch 214 process, for example. The anisotropic etch process 214 preferably comprises a gas containing C, H, F, O, or combinations thereof, as examples, although alternatively, other methods and chemistries may also be used to form the second spacers 212.

The first liner 208 protects the top surfaces of the workpiece 202 and the feature 204 during the anisotropic etch process 214. Preferably, at least the top surface 215 of the feature 204 is left exposed after the anisotropic etch process 214, as shown. Alternatively, the top surface of the workpiece 202 may also be left exposed after the anisotropic etch process 214, (not shown).

In some embodiments, an additional etch process may be used to remove the first liner 208 from the top surface of the workpiece 202 and the top surface 215 of the feature 204, not shown in the figures. The optional etch process to remove the first liner 208 preferably comprises a gas containing C, H, F, O, or combinations thereof, as examples, although alternatively, other methods and chemistries may also be used.

Figure 8:
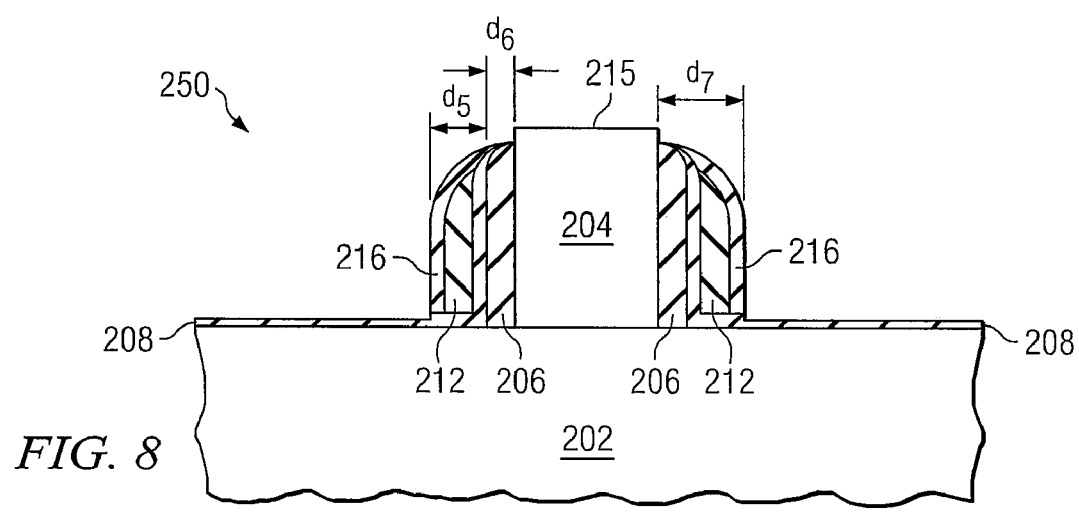

Preferably, the thickness of the second spacer 212 material and the anisotropic etch process 214 time and chemistry are selected so that the second spacer 212 after the anisotropic etch process 214 comprises the desired thickness that the second spacer 212 will retain in the end product, e.g., the thickness of the second spacer 212 shown in FIG. 8. Advantageously, an isotropic etch process is not used to form the second spacer 212, in accordance with embodiments of the present invention, for example.

Next, a second liner 216 is formed over the second spacer 212, the top surface 215 of the feature 204, and exposed portions of the first liner 208 as shown in FIG. 6, or over exposed portions of the workpiece 202, if the first liner 208 was removed from over the top surface of the workpiece 202 (not shown). The second liner 216 is also referred to herein as a second material layer or a third oxide layer (for example, in the claims). The second liner 216 preferably comprises the first material that the first spacer 206 and the first liner 208 comprise, in one embodiment. The second liner 216 preferably comprises a substantially conformal deposition of about 50 Angstroms or less of silicon dioxide in one embodiment, for example, although alternatively, the second liner 216 may comprise other materials and dimensions. The second liner 216 may be deposited using a similar deposition technique as described for the deposition of the first spacer 206 material, for example.

A third spacer 218 is formed over the second liner 208 over at least the sidewalls of the feature 204, as shown in FIGS. 6 and 7. The third spacer 218 is also referred to herein as a second portion of a nitride spacer (e.g., previously in this Detailed Description of Illustrative Embodiments section), or a third material layer or a second nitride layer (e.g., in the claims). The third spacer 218 functions as a sacrificial spacer and is later removed from the semiconductor device 250 in preferred embodiments of the present invention.

To form the third spacer 218, first, a third spacer 218 material is deposited over the second liner 216. The third spacer 218 material preferably comprises a material that may be etched selectively to the second liner 216 material, for example. The third spacer 216 material preferably comprises the second material that the second spacer 216 comprises, wherein the second material is different than the first material of the first liner 208, the first spacer 206, and the second liner 208, in one embodiment.

The third spacer 218 material preferably comprises a nitride material, for example. The third spacer 218 material preferably comprises silicon nitride deposited in a thickness of about 200 Angstroms or less in one embodiment, although alternatively, the third spacer 218 may comprise other materials and dimensions. The third spacer 218 material may be deposited by CVD, ALD, MOCVD, PVD, or JVD, as examples, although alternatively, the third spacer 218 material may be deposited using other suitable deposition techniques. The third spacer 218 material is preferably substantially conformal as deposited, as shown in FIG. 6.

Next, an anisotropic etch process 220 is used to remove the third spacer 218 material from the top surfaces of the feature 204 and optionally, also from the top surfaces of the workpiece 202 (not shown), leaving third spacers 218 formed on the sidewalls of the feature 204 over the second liner 216, as shown in FIG. 7. The third spacers 218 may be recessed slightly below the top surface of the feature 204, and/or also may be recessed slightly below the top surface of the first spacer 206, first liner 208, second spacer 212, and second liner 216 formed on the sidewalls of the feature 204, as shown, due to the directional etch of the anisotropic etch 220 process, for example. The anisotropic etch process 220 preferably comprises a gas containing C, H, F, O, or combinations thereof, as examples, although alternatively, other methods and chemistries may also be used to form the third spacers 218.

The second liner 216 and the first liner 208, if still present, protect the top surfaces of the workpiece 202 and the feature 204 during the anisotropic etch process 220. Preferably, at least the top surface 215 of the feature 204 is left exposed after the anisotropic etch process 220, as shown. Alternatively, the top surface of the workpiece 202 may also be left exposed after the anisotropic etch process 220 (not shown).

In some embodiments, an additional etch process may be used to remove the second liner 216 and the first liner 208, if still present, from the top surface of the workpiece 202 and the top surface 215 of the feature 204, not shown in the figures. The optional etch process to remove the second liner 216 and the first liner 208 preferably comprises a gas containing C, H, F, O, or combinations thereof, as examples, although alternatively, other methods and chemistries may also be used.

In an optional step, the third spacer 218 may be pulled back or reduced in size using an isotropic etch process 222, as shown in FIG. 7. The isotropic etch process 222 preferably comprises a gas containing C, H, F, O, or combinations thereof, as examples, although alternatively, other methods and chemistries may also be used. The optional isotropic etch process 222 may remove about 50 Angstroms or less, or about 10 Angstroms or greater, of the third spacer 218 material, decreasing the width of the third spacer 218, for example.

The total width $d_4$ of the first liner 208, second spacer 212, second liner 216, and the third spacer 218 preferably comprises a predetermined distance that is dependant upon the processing steps that will be performed next. For example, if a dopant species will be implanted into the workpiece 202 and/or the top surface 215 of the feature 204, then the width $d_4$ is preferably a suitable amount for the formation of the doped regions to be formed, such as source and drain regions of a transistor device. If a silicide will be formed on the workpiece 202 and/or top surface 215 of the feature 204, then the width $d_4$ is preferably a suitable amount for the formation of the silicide regions to be formed. Whether or not any anneal processes will be performed may also be a factor in determining the width $d_4$, for example.

Preferably, in one embodiment, the width $d_4$ comprises an amount equivalent to width $d_2$ shown in FIG. 3 of a desired width of a single nitride spacer and liner, for example. In some embodiments, the total width $d_4$ of the first liner 208, second spacer 212, second liner 216, and the third spacer 218 preferably comprises about 350 Angstroms or less, for example, although alternatively, the width $d_4$ may comprise other dimensions.

With the third spacer 218 left remaining in place, at least the workpiece 202 is affected, e.g., by a manufacturing process. The top surface of the feature 204 may also be affected, with the third spacer 218 left remaining in place, for example. Affecting at least the workpiece 202 may comprise implanting a dopant species into at least the workpiece 202, forming a silicide on at least the workpiece 202, and/or annealing the workpiece 202 (not shown), as examples, although alternatively, other procedures may be performed with the third spacer 218 left remaining in place.

After at least the workpiece 202 is affected with the manufacturing process, the third spacer 218 is removed, leaving the structure shown in FIG. 8. The third spacer 218 may be removed using an etch process comprising a gas containing C, H, F, O, or combinations thereof, as examples, although alternatively, other methods and chemistries may also be used. The etch process is preferably selective to the second liner 216, so that the underlying first second spacer 212 is not removed or deleteriously affected.

The width $d_5$ of the first liner 208, second spacer 212, and the second liner 216 preferably comprises a predetermined amount, and may comprise about 300 Angstroms or less in some embodiments. The width $d_6$ of the first spacer 206 preferably comprises about 100 angstroms or less, in some embodiments. The second liner 216 prevents the width of the second spacer 212 from being decreased during the removal of the third spacer 218, thus providing a highly controlled formation of a spacer 206/208/212/216 having a width $d_7$. Because the second spacer 212 is not removed or pulled back using an isotropic etch process, advantageously, the second spacer 212 comprises smooth surfaces, and the thickness is stable on the exterior sides. Advantageously, the thickness of the spacer 212 is the same and remains stable for isolated features and nested features across a workpiece 202, in accordance with embodiments of the present invention. A spacer 212 with a stable thickness and smooth surface improves the results of any subsequent stress effect processes that may be performed, for example. For example, after the manufacturing process steps shown in FIGS. 4 through 8, a tensile and/or compressive nitride film may be deposited and then etched away (not shown), resulting in enhanced stress and improved device 250 performance.

After the third spacer 218 is removed, manufacturing processes for the semiconductor device 250 are then continued. For example, dopant species (or additional dopant species, if dopant species were previously implanted) may be implanted into the workpiece, the workpiece 202 may be annealed to facilitate diffusion of the dopant species, and additional material layers may be deposited over the structure, for example, not shown. One or more stress effect processes may also be implemented, for example.

The processes used to etch the various spacer and liner materials may comprise etch processes comprising a gas containing C, H, F, O, or combinations thereof, as described herein. In some embodiments, if the spacer and liner material to be removed comprises silicon dioxide, then preferably then preferably $CF_4$, $C_4F_8$, $C_2F_6$, $C_5F_8$, $O_2$ gases or combinations thereof are used for the etch process, and if the spacer or liner material to be removed comprises silicon nitride, then preferably $CF_4$, $C_4F_8$, $C_2F_6$, $C_5F_8$, $O_2$, $CHF_3$, $CH_2F_2$, $CH_3F$ gases or combinations thereof are used for the etch process, as examples. To achieve an anisotropic etch process or an isotropic etch process, preferably parameters such as source power, bias power, pressure, and other parameters are selected in order to achieve the desired directionality or non-directionality of a particular etch process, as examples.

Figure 9:
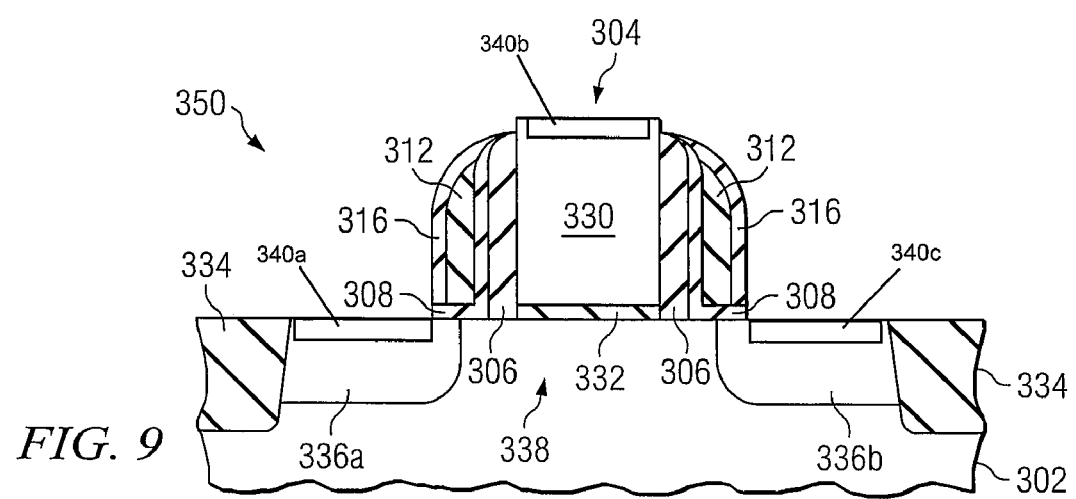
FIG. 9 shows a transistor device manufactured in accordance with an embodiment of the present invention.

FIG. 9 shows a cross-sectional view of a transistor device 350 manufactured in accordance with an embodiment of the present invention. Like numerals are used for the various elements that were described in FIGS. 4 through 8. To avoid repetition, each reference number shown in FIG. 9 is not described again in detail herein. Rather, similar materials x02, x04, x06, x08, etc., are preferably used for the various material layers shown as were described for FIGS. 4 through 8, where x=2 in FIGS. 4 through 8 and x=3 in FIG. 9. As an example, the preferred and alternative materials and dimensions described for the spacers 206 and 212 and liners 208 and 216 are preferably used for spacers 306 and 312 and liners 308 and 316, respectively, in FIG. 9.

To form the feature 304, a gate dielectric material 332 is deposited over the workpiece 302. The gate dielectric material 332 may comprise $SiO_2$, and in some embodiments, preferably comprises a high-k dielectric material having a dielectric constant of about 4.0 or greater, in one embodiment. The gate dielectric material 332 preferably comprises $SiO_2$, nitrides thereof, $Si_xN_y$, SiON, or combinations thereof, as examples, although alternatively, the gate dielectric material 332 may comprise other dielectric materials. The gate dielectric material 332 may comprise a single layer of material, or alternatively, the gate dielectric material 332 may comprise two or more layers. The gate dielectric material 332 may be deposited by CVD, ALD, MOCVD, PVD, or JVD, as examples, although alternatively, the gate dielectric material 332 may be deposited using other suitable deposition techniques. The gate dielectric material 332 preferably comprises a thickness of about 80 Angstroms or less in one embodiment, although alternatively, the gate dielectric material 332 may comprise other dimensions.

A gate material 330 is deposited over the gate dielectric material 332. The gate material 330 preferably comprises a conductor, such as a metal or polysilicon, although alternatively, other conductive and semiconductive materials may be used for the first gate material 330. For example, the gate material 330 may comprise polysilicon or other semiconductor materials, tungsten, silicides thereof, a fully silicided gate material (FUSI), other metals, and/or combinations thereof, as examples. In the present example, gate material 330 has been silicided after the formation of the spacer 306/308/312/316, to form silicide layer 340b. The gate material 330 may comprise a plurality of stacked gate materials, such as a metal underlayer with a polysilicon cap layer disposed over the metal underlayer, or a combination of a plurality of metal layers that form a gate electrode stack, as examples. The gate material 330 may be deposited using CVD, PVD, ALD, or other deposition techniques, as examples. The gate material 330 preferably comprises a thickness of about 1000 Angstroms to about 2000 Angstroms, or other dimensions, for example.

A layer of photoresist is deposited over the gate material 330 (not shown). The layer of photoresist may be patterned using a mask using traditional lithography techniques, although alternatively, the layer of photoresist may be directly patterned. The layer of photoresist may be used as a mask to pattern the gate material 330 and the gate dielectric material 332. For example, exposed portions of the gate material 330 and gate dielectric material 332 may be etched away from the workpiece 302 using the layer of photoresist as a mask. The layer of photoresist is then stripped or removed from over the workpiece 302. The patterned gate 330 and gate dielectric 332 comprise the feature 304 of the semiconductor device 350.

The oxide liners 308 and 316, oxide spacer 306, and nitride spacers 312 (and also sacrificial nitride spacer 218, not shown) are formed as described with reference to the embodiment shown in FIGS. 4 through 8. Source and drain regions 336a and 336b are formed in the workpiece 302 proximate the spacer 306/308/312/316, with the sacrificial nitride spacer (not shown in FIG. 9; see spacer 218 in FIG. 7) in place, for example. The source and drain regions 336a and 336b may also be silicided, for example, with silicide layers 340a and 340c. The source and drain region 336a and 336b are separated by a channel region 338, as shown. The gate 330 may also be implanted with dopant species and/or silicided, for example. Isolation regions 334 may be formed proximate the transistor device 350 to provide isolation between adjacent transistor devices 350, as shown.

Manufacturing of the transistor device 350 is then continued to complete the fabrication of the transistor device 350. For example, one or more insulating materials (not shown) may be deposited over the transistor 350, and contacts may be formed in the insulating materials in order to make electrical contact with the gate 330, source region 336a and/or drain region 336b. Additional metallization and insulating layers may be formed and patterned over the top surface of the insulating material and contacts. A passivation layer (not shown) may be deposited over the insulating layers or the transistor 350. Bond pads (also not shown) may be formed over contacts, and the transistor device 350 may then be singulated or separated into individual die. The bond pads may be connected to leads of an integrated circuit package (not shown) or other die, for example, in order to provide electrical contact to the transistor device 350.

Embodiments of the present invention may also be implemented to form sidewall spacers on other types of vertical features, in applications and devices such as capacitors, diodes, conductive lines, memory devices, or multiple gate transistors as examples, although other applications and devices may also benefit from the novel methods of forming sidewall spacers described herein.

Advantages of embodiments of the invention include providing novel methods of forming insulating spacers on sidewalls of features of semiconductor devices. The spacers have a well-controlled width, thickness and have smooth edges, so that subsequent stress effect processes are stable for all devices formed on a workpiece. For example, a semiconductor device 200 such as the one shown in FIG. 8 may be subjected to a stress effect process after the manufacturing process steps described herein.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:

providing a workpiece;

forming at least one feature over the workpiece, the at least one feature having a top surface and sidewalls;

forming a first material layer over the at least one feature and over the workpiece, the first material layer comprising a first material;

removing the first material layer from over the workpiece and from over the top surface of the at least one feature, leaving the first material layer over the sidewalls of the at least one feature;

forming a second material layer over the workpiece, the at least one feature, and the first material layer, the second material layer comprising a second material;

forming a third material layer over the second material layer, the third material layer comprising the first material;

removing at least the third material layer from over the workpiece and from over the top surface of the at least one feature, leaving the third material layer over the sidewalls of the at least one feature;

affecting at least the workpiece; and removing the third material layer from over the sidewalls of the at least one feature, wherein removing the first material layer from over the workpiece and from over the top surface of the at least one feature and removing the third material layer from over the workpiece and from over the top surface of the at least one feature comprise anisotropic etch processes, and wherein removing the third material layer from over the sidewalls of the at least one feature comprises an isotropic etch process.

2. The method according to claim 1, wherein the second material is different than the first material.

3. The method according to claim 1, wherein the first material comprises a nitride material, and wherein the second material comprises an oxide material.

4. The method according to claim 1, wherein affecting at least the workpiece comprises implanting a dopant species into at least the workpiece, forming a silicide on at least the workpiece, and/or annealing the workpiece.

5. The method according to claim 4, wherein affecting at least the workpiece further comprises implanting the dopant species into the top surface of the at least one feature, and/or forming the silicide on at least the top surface of at least one feature.

6. The method according to claim 1, further comprising, before forming the first material layer:

forming a fourth material layer over the at least one feature and over the workpiece, the fourth material layer comprising the second material;

removing the fourth material layer from over the workpiece and top surface of the at least one feature, leaving the fourth material layer over the sidewalls of the at least one feature; and forming a fifth material layer over the fourth material, the workpiece, and the top surface of the at least one feature, the fifth material layer comprising the second material.

7. A method of forming a sidewall spacer on a feature of a semiconductor device, the method comprising:

providing a workpiece, the workpiece comprising a feature formed thereon, the feature having sidewalls and a top surface;

forming a first oxide layer over the workpiece and over the feature;

anisotropic ally etching the first oxide layer, removing the first oxide layer from over the top surface of the feature and the workpiece, leaving the first oxide layer on the sidewalls of the feature;

forming a second oxide layer over the top surface of the feature, the workpiece, and the first oxide layer;

forming a first nitride layer over the second oxide layer;

anisotropically etching the first nitride layer, removing the first nitride layer from over the top surface of the feature and the workpiece, leaving the first nitride layer on the sidewalls of the feature;

forming a third oxide layer over the top surface of the feature, the workpiece, and the first nitride layer;

forming a second nitride layer over the third oxide layer;

removing the second nitride layer from over the workpiece and from over the top surface of the feature, leaving the second nitride layer over the sidewalls of the feature;

affecting at least the workpiece; and removing the second nitride layer from over the sidewalls of the feature.

8. The method according to claim 7, wherein the feature comprises a gate dielectric and a gate disposed over the gate dielectric.

9. The method according to claim 7, wherein forming the first nitride layer comprises forming a layer of silicon nitride having a thickness of about 200 Angstroms or less, and wherein forming the second nitride layer comprises forming a layer of silicon nitride having a thickness of about 200 Angstroms or less.

10. The method according to claim 7, wherein forming the first oxide layer comprises forming a layer of silicon dioxide having a thickness of about 150 Angstroms or less, wherein forming the second oxide layer comprises forming a layer of silicon dioxide having a thickness of about 50 Angstroms or less, and wherein forming the third oxide layer comprises forming a layer of silicon dioxide having a thickness of about 50 Angstroms or less.

11. The method according to claim 7, wherein affecting at least the workpiece comprises implanting a dopant species into at least the workpiece, forming a silicide on at least the workpiece, and/or annealing the workpiece.

12. The method according to claim 11, further comprising removing the second oxide layer from over the top surface of the feature and the workpiece, before affecting at least the workpiece.

13. The method according to claim 11, wherein affecting at least the workpiece further comprises implanting the dopant species into the top surface of the feature, or forming the silicide on the top surface of the feature.

14. The method according to claim 7, wherein removing the second nitride layer from over the workpiece and from over the top surface of the feature comprises a first etch process and a second etch process.

15. The method according to claim 7, wherein the first etch process comprises an anisotropic etch process, and wherein the second etch process comprises an isotropic etch process.

16. The method according to claim 7, wherein the feature comprises a portion of a capacitor, diode, conductive line, memory device, single gate transistor, or multiple gate transistor.

* * * * *